(12) United States Patent
Chen et al.

(10) Patent No.: US 6,231,144 B1
(45) Date of Patent: May 15, 2001

(54) REMOVABLE CHASSIS FOR ELECTRONIC DEVICE

(75) Inventors: Yun-Long Chen, Chung-Ho; Yu-Tai Liu, Hsin-Chuang; Alvin Liu, Pa-Li, all of (TW)

(73) Assignee: Hon Hai Precision Ind. Co., Ltd., Taipei Hsein (TW)

( * ) Notice: Subject to any disclaimer, the term of this patent is extended or adjusted under 35 U.S.C. 154(b) by 0 days.

(21) Appl. No.: 09/379,701

(22) Filed: Aug. 24, 1999

(30) Foreign Application Priority Data

Mar. 16, 1999  (TW) ................................. 88203910

(51) Int. Cl.[7] ..................................... H05K 7/18
(52) U.S. Cl. ..................... 312/332.1; 312/223.2
(58) Field of Search ............... 312/332.1, 223.2, 312/223.1, 216, 218, 330.1, 333; 361/685, 725–727, 732, 754, 747, 801, 759, 740, 683, 684, 798; 439/157, 159, 160; 292/8, 11, 26, 118, 158, 213

(56) References Cited

U.S. PATENT DOCUMENTS

| | | | |
|---|---|---|---|
| 3,120,412 | * | 2/1964 | Caldwell ........................... 312/332.1 |
| 3,367,732 | * | 2/1968 | Beye ................................. 312/332.1 |
| 3,467,461 | * | 9/1969 | Hauser ........................... 312/332.1 X |
| 3,521,939 | * | 7/1970 | Fall et al. ........................... 312/332.1 |
| 5,020,151 | * | 5/1991 | Sampei et al. ..................... 361/727 X |
| 5,503,440 | * | 4/1996 | Peccoux ........................... 312/218 X |
| 5,761,045 | * | 6/1998 | Olson et al. ................... 312/223.2 X |
| 5,791,753 | * | 8/1998 | Paquin .............................. 312/332.1 |

* cited by examiner

Primary Examiner—Janet M. Wilkens
(74) Attorney, Agent, or Firm—Wei Te Chung

(57) ABSTRACT

A removable chassis is movably received in a casing of a computer. The chassis has a panel forming opposite side flanges and a pair of slide plates movably attached to the side flanges. Each slide plate forms at least a catch engaging with a locking aperture defined in the casing when the slide plate is moved to a secured position for securing the chassis in the casing. A handle has two free ends pivotally attached to the side flanges. An elongate slot is defined in each free end for movably receiving and drivingly engaging with a driving pin extending from the corresponding slide plate whereby when the handle is rotated, the slide plates are moved toward/away from the secured position for locking/releasing the catches. Each free end of the handle forms a camming surface drivingly engaging with a surface of the casing whereby when the handle is rotated and releases the catches, the camming surface exerts a separation force to the casing for separating the chassis from the casing. A notch is defined in each free end of the handle for engaging with a peg mounted on the corresponding side flange to retain the handle at the secured position.

16 Claims, 5 Drawing Sheets

REMOVABLE CHASSIS FOR ELECTRONIC DEVICE

BACKGROUND OF THE INVENTION

1. Field of the Invention

The present invention generally relates to a chassis for an electronic device which readily separates from a casing thereof, and in particular to a drawer type chassis for an electronic device.

2. The Prior Art

Electronic apparatus, such as personal computers, usually comprise a chassis for supporting and fixing components thereof. A casing is mounted to the chassis to shield and cover the components. Some of the conventional casings are made from a single metal plate by stamping or similar mechanical operations whereby the casing is deformable for fitting over the chassis. Mounting/dismounting the casing is inconvenient and laborious. Furthermore, sharp edges of the casing formed during the stamping operation may injure a user trying to mount/dismount the casing.

Other conventional casings are made of several separate panels joined together by releasable engaging means. Examples are disclosed in Taiwan Patent Application Nos. 84207631 and 84215198. Fixing the panels together to form the casing is time-consuming and laborious. Besides, the separate panels may also have sharp edges that could injure a user.

Some computers comprise a removable internal support member which is removably mounted inside an external casing member, such as that disclosed in Taiwan Patent Application No. 84213528. The internal support member is used to support a power supply and/or a disk drive. The support member is usually configured to substantially enclose the power supply/disk drive for electromagnetic interference (EMI) protection. The removable support member provides an efficient way to move the power supply/disk drive in and out of the casing. However, the internal support member is not capable to movably support other components of the computer and may be mechanically unstable.

It is thus desired to provide a removable chassis for an electronic device which overcomes the above problems.

SUMMARY OF THE INVENTION

Accordingly, an object of the present invention is to provide a removable chassis for an electronic device which may be readily and safely separated from a casing thereof.

Another object of the present invention is to provide a removable chassis for an electronic device which stably supports components of the electronic device inside a casing thereof.

A further object of the present invention is to provide a removable chassis for an electronic device which is received in and is in tight engagement with a casing for EMI and RFI protection.

To achieve the above objects, a removable chassis in accordance with the present invention is adapted to be movably received and releasably retained in a casing of an electronic device for supporting components thereof. The casing defines an opening for receiving the chassis and the chassis comprises a panel sized to substantially close the opening. The panel forms opposite side flanges abuttingly engaging with ribs formed inside the casing for EMI protection. A pair of slide plates is movably attached to the side flanges. Each slide plate forms at least a catch engaging with a locking aperture defined in the corresponding rib when the slide plate is moved to a secured position for securing the chassis in the casing. A handle has two free ends pivotally attached to the side flanges. An elongate slot is defined in each free end for movably receiving and drivingly engaging with a driving pin extending from the corresponding slide plate whereby when the handle is rotated, the slide plates are moved toward/away from the secured position for locking/releasing the catches. Each free end of the handle forms a camming surface drivingly engaging with a surface of the casing whereby when the handle is rotated and releases the catches, the camming surface exerts a separation force against the casing for separating the chassis from the casing. A notch is defined in each free end of the handle for engaging with a peg mounted on the corresponding side flange to retain the handle at the secured position.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
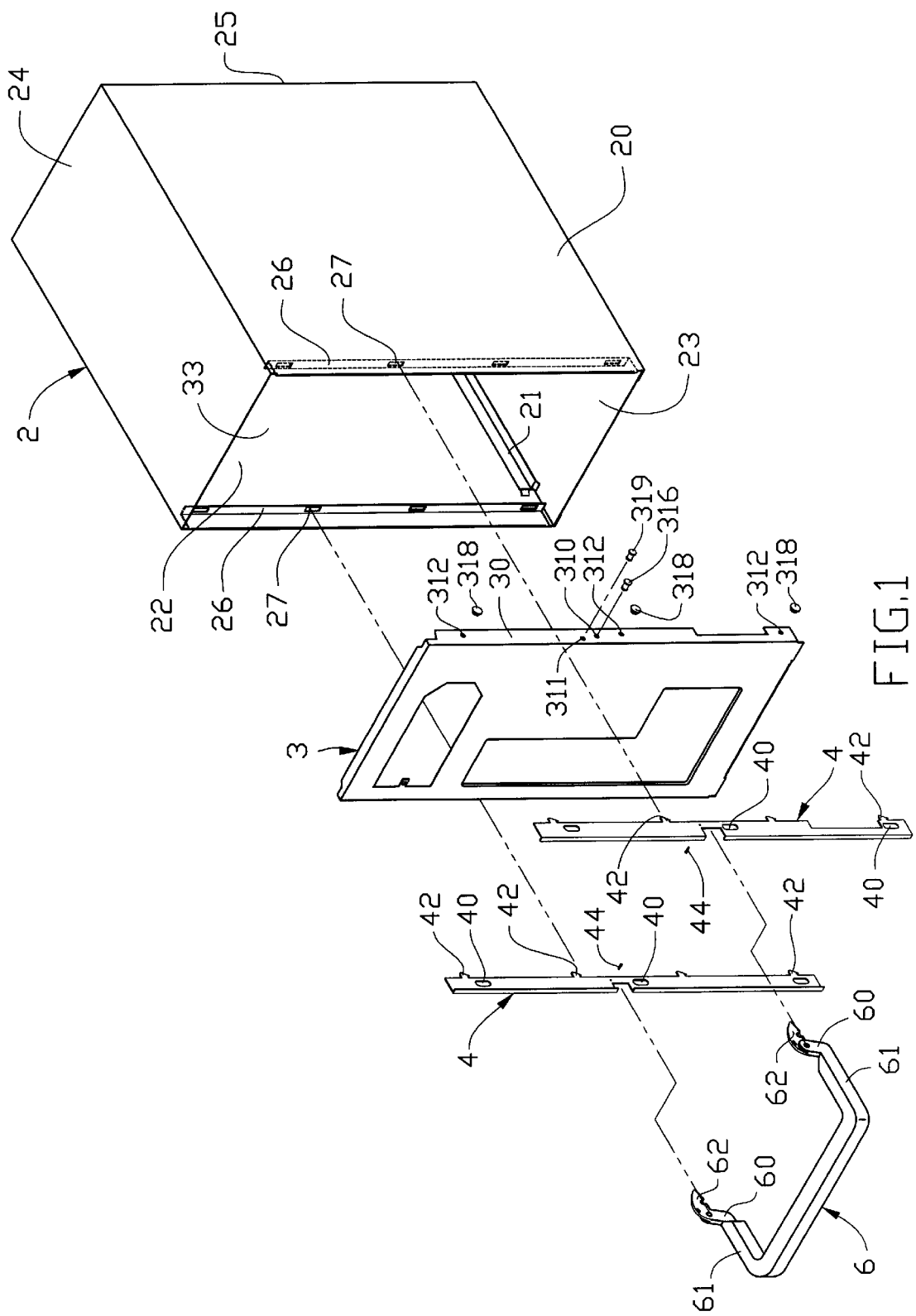
FIG. 1 is an exploded view of a removable chassis constructed in accordance with the present invention to be received in a casing of an electronic device.
Figure 2:
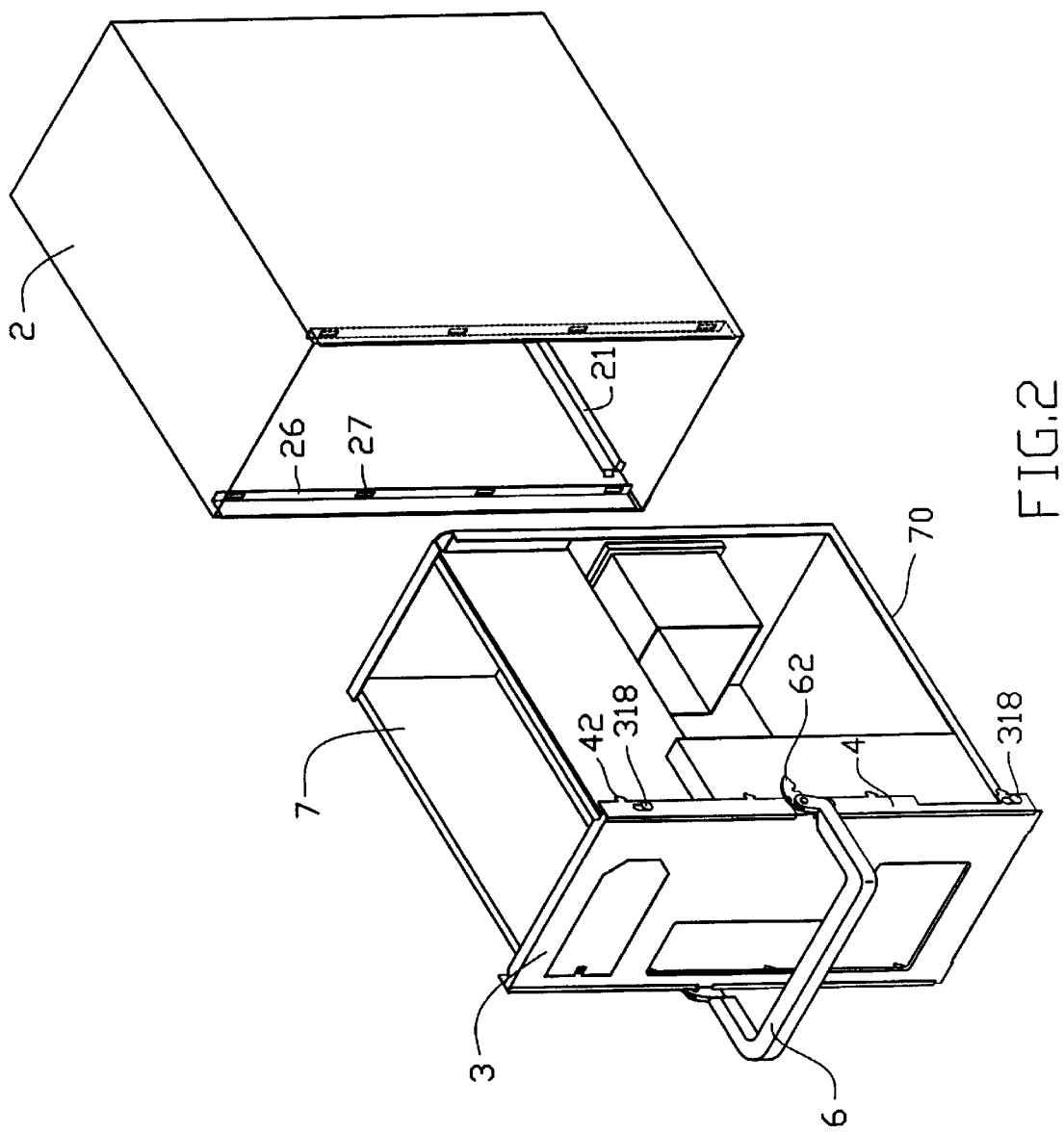
FIG. 2 is similar to FIG. 1 but showing the chassis assembled together.
Figure 3:
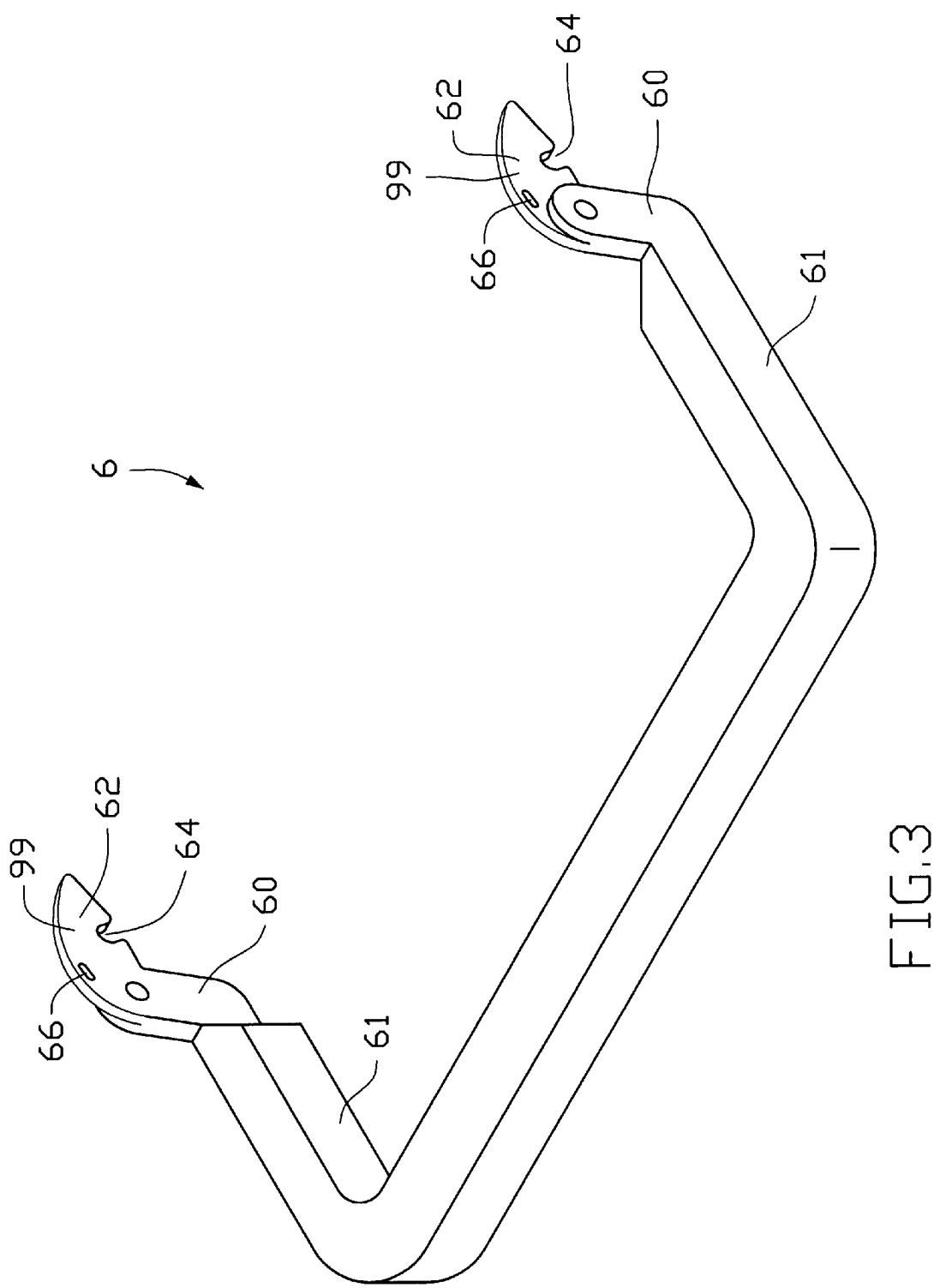
FIG. 3 is a perspective view of a handle of the removable chassis.

Referring to the drawings and in particular to FIGS. 1 and 2, an electronic device comprises a casing 2 in which a removable chassis 7 constructed in accordance with the present invention is movably received and releasably retained. In the embodiment illustrated, the electronic device is a personal computer, and more particularly, a desktop personal computer. However, the personal computer is only an example of an application in which the present invention may be utilized. The present invention may also be applied to other electronic devices.

The casing 2 comprises opposite side panels 20, 22, a top panel 24, a bottom panel 23 and a front panel 25 and defines a rear opening 33 for receiving the chassis 7. A pair of sliding rails 21 (only one being visible in the drawings) is mounted on the bottom panel 23 for slidably supporting the chassis 7. Each side panel 20, 22 forms an internal rib 26 opposite each other. At least one locking aperture 27 is defined in each rib 26. In the embodiment illustrated, four such locking apertures 27 are defined in each rib 26.

The chassis 7 comprises a frame 70 (not shown in FIG. 1) slidably supported on the rails 21 whereby the chassis 7 is selectively received in the casing 2 or removed from the casing 2. A rear panel 3 is fixed to the frame 70 and is dimensioned to substantially close the rear opening 22 of the casing 2 when the chassis 7 is completely received in the casing 2.

Figure 4:
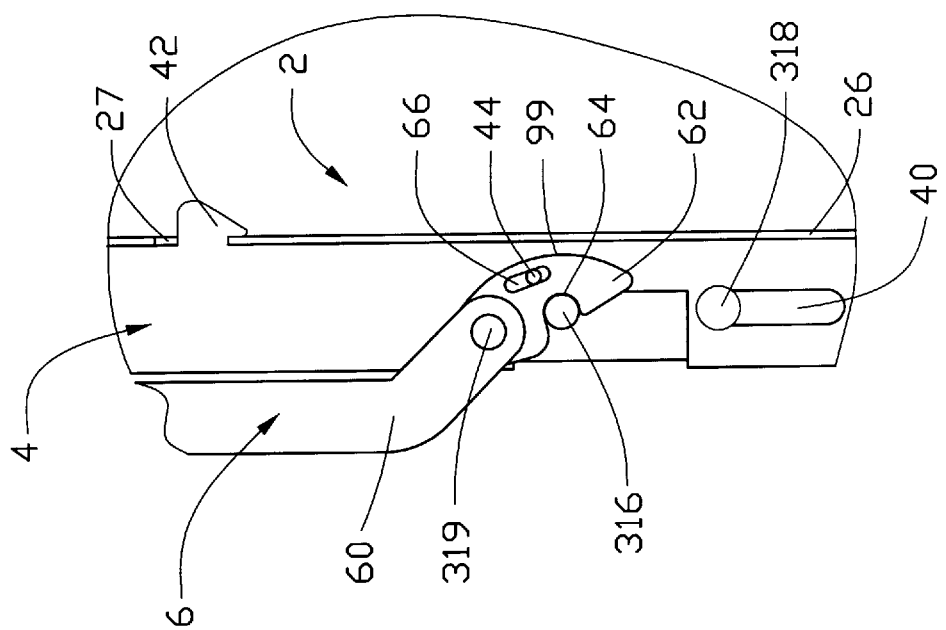
FIG. 4 is a partial side elevational view showing the handle at a secured position.
Figure 5:
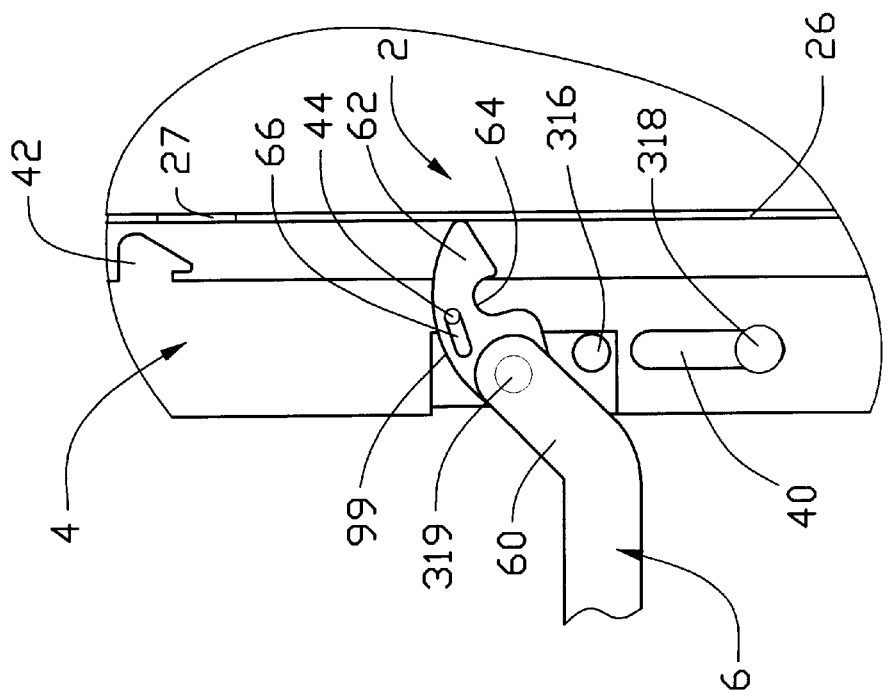
FIG. 5 is similar to FIG. 4 but showing the handle at an intermediate position.

The rear panel 3 forms opposite side flanges 30 to each of which a slide plate 4 is movably attached. Each side flange 30 defines a plurality of holes 312 and each slide plate 4 defines a plurality of elongate slots 40 corresponding to the holes 312. A guide pin 318 extends through each elongate slot 30 of each slide plate 4 and is attached to the corresponding side flange 30 by engaging with the corresponding hole 312 for guiding the movement of the chassis 7. The guide pins 3/8 may have a threaded section threadingly engaging with an inner threading of the corresponding holes 312. The length of the elongate slots 40 allows the slide plates 4 to move with respect to the pins 318 and the side flanges 30 between a locked position as shown in FIG. 4 and an unlocked position as shown in FIG. 5. In the embodiment illustrated, each side flange 30 defines three such holes 312 and each slide plate 4 defines three elongate slots 40 corresponding thereto.

The side flanges 30 contact the corresponding ribs 26 of the casing 2 when the chassis 7 is received in the casing 2 for purposes of electromagnetic interference (EMI) protection.

Also referring to FIGS. 4 and 5, each slide plate 4 forms at least one catch 42 extending beyond the corresponding side flange 30 of the rear panel 3. The catch 42 extends into the corresponding locking aperture 27 of the rib 26 and is allowed to move with respect thereto by the movement of the slide plate 4, whereby when the slide plate 4 is moved to the locked position, as shown in FIG. 4, the catch 42 engages with an edge of the locking aperture 27 for securing the rear panel 3 and thus the chassis 7 to the casing 2. When the slide plate 4 is moved to the unlocked position, as shown in FIG. 5, the catch 42 disengages from the aperture 27 to allow the chassis 7 to be separated from the casing 2.

Figure 6:
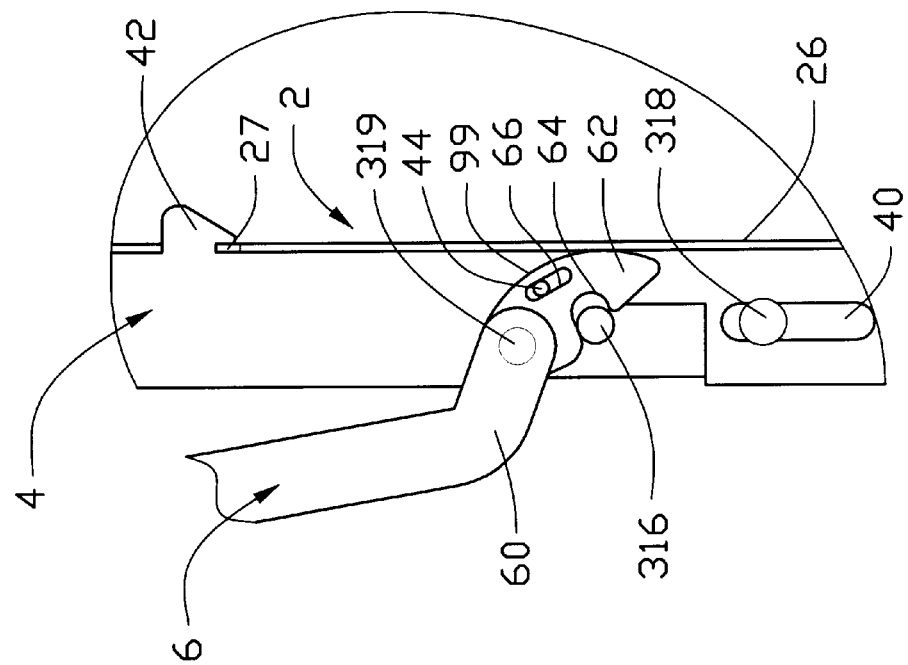
FIG. 6 is similar to FIG. 5 but showing the handle at a released position.

A handle 6 in the form of a U-shape has two limbs 61, each having a free end 60 pivotally attached to the corresponding side flange 30 of the rear panel 3 by a trunnion 319, whereby the handle 6 is rotatable with respect to the rear panel 3 between a first secured position, shown in FIG. 4, and a second released position, shown in FIG. 6, via an intermediate position, shown in FIG. 5. The secured position of the handle 6 corresponds to the locked position of the slide plates 4 and the released position of the handle 6 corresponds to the unlocked position of the slide plates 4.

In the embodiment illustrated, each trunnion 319 comprises a pin received and fixed to a hole 311 defined in the corresponding side flange 30 of the rear panel 3.

A cam 62 is mounted to the free end 60 of each limb 61 and is rotated by the handle 6 about the trunnion 319. The cam 62 forms an arcuate camming surface 99 slidingly engaging with the corresponding rib 26 of the casing 2 whereby when the handle 6 is rotated from the secured position to the released position, the camming surface 99 is forced to slide on the rib 26 and exerts a separation force thereto.

A peg 316 is received in a hole 310 defined in each slide plate 4 for being fixed thereto. Each cam 62 defines a notch 64 engageable with the peg 316 when the handle 6 is moved to the secured position for retaining the handle 6 at the secured position as shown in FIG. 4. A driving pin 44 is fixed to each slide plate 4, preferably by tightly extending through a hole defined in the slide plate 4, and is received in and drivingly engages with an elongate slot 66 defined in the cam 62 whereby when the handle 6 is moved from the secured position to the intermediate position, the slide plate 4 is driven by the driving pin 44 from the locked position to the unlocked position and the catches 42 disengage from the locking apertures 27. Further moving the handle 6 from the intermediate position to the released position causes the rear panel 3 to separate from the casing 2 by means of the separation forces resulting from camming action of the cams 62 against the ribs 26 of the casing 2. The chassis 7 is thus removed from the casing 2.

Although the present invention has been described with reference to the preferred embodiment, it is apparent to those skilled in the art that a variety of modifications and changes may be made without departing from the scope of the present invention which is intended to be defined by the appended claims.

What is claimed is:

1. A computer enclosure comprising a casing and a chassis movably received in the casing, the removable chassis comprising a frame adapted to be movably received in the casing and a panel fixed to the frame, a pair of ribs being mounted to the casing, each rib defining at least one locking aperture, releasable securing means for securing the chassis in the casing comprising a pair of slide plates movably attached to opposite side flanges of the panel, each slide plate forming a catch engageable with the locking aperture of a respective said rib for securing the chassis to the casing, and a handle pivotally attached to the chassis for being movable between a secured position and a released position and mechanically coupled to the securing means for releasing the securing means when moved to the released position and thus separating the chassis from the casing.

2. The computer enclosure as claimed in claim 1, wherein rails are mounted on a bottom panel of the casing for slidably supporting the frame of the chassis.

3. The computer enclosure as claimed in claim 1, wherein the casing defines an opening for receiving the chassis, the panel of the chassis being sized to substantially close the opening of the casing when moved to the secured position.

4. The computer enclosure as claimed in claim 1, wherein each slide plate defines at least one elongate slot for receiving a guide pin extending from the panel of the chassis to guide the movement of the slide plate with respect to the panel.

5. The computer enclosure as claimed in claim 1, wherein the handle has two free ends pivotally attached to the panel of the chassis, each free end defining an elongate slot for receiving and drivingly engaging with a driving pin mounted to the corresponding slide plate whereby when the handle is moved to the secured position, the catches of the slide plates engage with the locking apertures.

6. The computer enclosure as claimed in claim 5, wherein a cam is formed on each free end of the handle for cammingly engaging with a surface of the casing whereby when the handle is rotated and releases the catches from the locking apertures, a separation force is exerted to the casing by the cams to separate the chassis from the casing.

7. The computer enclosure as claimed in claim 6, wherein the pair of ribs is formed in the casing each rib forming the surface with which the corresponding cam drivingly engages.

8. The computer enclosure as claimed in claim 1, wherein the handle defines at least one notch engageable with a peg formed on the panel of the chassis for retaining the handle at the secured position when the handle is moved to the secured position.

9. A computer enclosure comprising a casing and a chassis movably received in the casing, releasable securing means for securing the chassis in the casing comprising a pair of side-plates movably attached to opposite flanges of the chassis and corresponding to ribs formed in the casing, each side plate forming at least one catch engageable with a corresponding locking aperture defined in the corresponding rib, a handle pivotally attached to the chassis for being movable between a secured position and a released position and mechanically coupled to the securing means for releasing the securing means when moved to the released position and thus separating the chassis from the casing.

10. The computer enclosure as claimed in claim 9 further comprising rails mounted on a bottom panel of the casing for slidably supporting the chassis.

11. The computer enclosure as claimed in claim 9, wherein the casing defines an opening for receiving the chassis, the chassis comprising a panel sized to substantially close the opening of the casing when moved to the secured position.

12. The computer enclosure as claimed in claim 9, wherein each slide plate defines at least one elongate slot for receiving a guide pin extending from the chassis to guide the movement of the slide plate with respect to the chassis.

13. The computer enclosure as claimed in claim 9, wherein the handle has two free ends pivotally attached to the chassis, each free end defining an elongate slot for receiving and drivingly engaging with a driving pin mounted to the corresponding slide plate whereby when the handle is moved to the secured position, the catches of the slide plates engage with the locking apertures.

14. The computer enclosure as claimed in claim 13, wherein a cam is formed on each free end of the handle for cammingly engaging with a surface of the casing whereby when the handle is rotated and releases the catches from the locking apertures, a separation force is exerted to the casing by the cams to separate the chassis from the casing.

15. The computer enclosure as claimed in claim 9, wherein the handle defines at least one notch engageable with a peg formed on the chassis for retaining the handle at the secured position when the handle is moved to the secured position.

16. A computer enclosure comprising a casing and a chassis moveably received within the casing, a handle rotatably movable with regard to the chassis between a first position and a second position and a slide plate coupled to and driven by the handle to be linearly movable with regard to the chassis between a locked position and an unlocked position corresponding to the first and second positions of the handle, said slide plate defining means for locking the chassis to the casing when moved to the locking position and means for retaining the handle at the first position comprising a notch defined in the handle for engaging with a peg formed on the chassis.

* * * * *